(12) United States Patent
Sukhwani et al.

(10) Patent No.: US 8,838,577 B2
(45) Date of Patent: Sep. 16, 2014

(54) ACCELERATED ROW DECOMPRESSION

(75) Inventors: Bharat Sukhwani, Briarcliff Manor, NY (US); Sameh Asaad, Briarcliff Manor, NY (US); Balakrishna Raghavendra Iyer, San Jose, CA (US); Hong Min, Poughkeepsie, NY (US); Mathew S. Thoennes, West Harrison, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/556,648

(22) Filed: Jul. 24, 2012

(65) Prior Publication Data

US 2014/0032516 A1 Jan. 30, 2014

(51) Int. Cl.
*G06F 7/00* (2006.01)

(52) U.S. Cl.
USPC .......................................................... 707/715

(58) Field of Classification Search
USPC .......................................................... 707/715
See application file for complete search history.

(56) References Cited

U.S. PATENT DOCUMENTS

| | | | |
|---|---|---|---|
| 7,769,729 B2 | 8/2010 | Faerber et al. | |
| 2002/0091905 A1* | 7/2002 | Geiger et al. | 711/170 |
| 2006/0123035 A1* | 6/2006 | Ivie | 707/101 |
| 2008/0222136 A1 | 9/2008 | Yates et al. | |
| 2010/0281004 A1 | 11/2010 | Kapoor et al. | |
| 2011/0252008 A1 | 10/2011 | Chamberlain et al. | |
| 2011/0313980 A1 | 12/2011 | Faerber et al. | |

OTHER PUBLICATIONS

Balakrisha R. Iyer et al., "Data Compression Support in Databases," 20th International Conference on Very Large Data Bases (VLDB), Sep. 1994, pp. 695-704, Santiago, Chile.
Wikipedia, "Field-Programmable Gate Array," http://en.wikipedia.org/wiki/Field-programmable_gate_array, Jun. 2012, 13 pages.
IBM, "z/Architecture, Principles of Operation," SA22-7832-06, Seventh Edition, Feb. 2008, 1292 pages.
Takashi Horikawa, "An Unexpected Scalability Bottleneck in a DBMS: A Hidden Pitfall in Implementing Mutual Exclusion," Proceedings of the IASTED International Conference, Parallel and Distributed Computing and Systems (PDCS), Dec. 2011, pp. 10-17.
Ryan Johnson et al., "Row-Wise Parallel Predicate Evaluation," Proceedings of the Very Large Data Bases (VLDB) Endowment, Aug. 2008, pp. 622-634, vol. 1, No. 1, Auckland, New Zealand.
Jens Krueger et al., "Fast Updates on Read-Optimized Databases Using Multi-Core CPUs," Proceedings of the Very Large Data Bases (VLDB) Endowment, Sep. 2011, pp. 61-72, vol. 5, No. 1.

(Continued)

*Primary Examiner* — Truong Vo
(74) *Attorney, Agent, or Firm* — Anne V. Dougherty; Ryan, Mason & Lewis, LLP

(57) ABSTRACT

An apparatus comprises a hardware accelerator coupled to a memory. The hardware accelerator comprises one or more decompression units. The one or more decompression units are reconfigurable. The hardware accelerator may be a field-programmable gate array. The hardware accelerator may also comprise one or more reconfigurable scanner units. The one or more decompression units, in the aggregate, are operative to decompress one or more rows of a database at a bus speed of the coupling between the hardware accelerator and the memory. Two or more decompression units are operative to decompress two or more rows of a database in parallel. The apparatus allows for hardware accelerated row decompression.

20 Claims, 6 Drawing Sheets

(56) References Cited

OTHER PUBLICATIONS

Kelvin T. Leung et al., "Exploiting Reconfigurable FPGA for Parallel Query Processing in Computation Intensive Data Mining Applications," UC Micro Technical Report, Jun. 1999, 4 pages.

Boon-Wee Low et al., "Exploration on Scalability of Database Bulk Insertion with Multi-Threading," International Journal on New Computer Architectures and Their Applications (IJNCAA), The Society of Digital Information and Wireless Communications (SDIWC), Jun. 2012, pp. 553-564, vol. 1, No. 1.

Rene Mueller et al., "FPGA: What's in it for a Database," ACM SIGMOD International Conference on Management of Data, Jun.-Jul. 2009, 6 pages.

Rene Mueller et al., "Glacier: A Query-to-Hardware Compiler," ACM SIGMOD International Conference on Management of Data, Jun. 2010, 4 pages.

Rene Mueller et al., "Data Processing on FPGAs," Proceedings of the Very Large Data Bases (VLDB) Endowment, Aug. 2009, pp. 910-921, vol. 2, No. 1, Lyon, France.

Raymond A. Lorie et al., An Access Specification Language for a Relational Data Base System, IBM Journal of Research and Development, May 1979, pp. 286-298, vol. 23, No. 3.

Nadathur Satish et al., "Fast Sort on CPUs and GPUs: a Case for Bandwidth Oblivious SIMD Sort," ACM SIGNMOD International Conference on Management of Data, Jun. 2010, pp. 351-362.

Jingren Zhou et al., "Implementing Database Operations Using SIMD Instructions," ACM SIGMOD International Conference on Management of Data, Jun. 2002, pp. 145-156.

"IBM Netezza Data Warehouse Appliances, The Simple Data Warehouse Appliance for Serious Analytics," http://www-01.ibm.com/software/data/netezza/, 3 pages.

"XpressGX4LP," http://www.plda.com/printdetail.php?pid-184, 2 pages.

"Teradata," http://www.teradata.com/, 2 pages.

IBM, "DB2 Analytics Accelerator for z/OS," http://www-01.ibm.com/software/data/db2/zos/analytics-accelerator/, 1 page.

U.S. Appl. No. 13/478,507 filed in the name of B. Sukhwani et al. on May 23, 2012 and entitled "Hardware-Accelerated Relational Joins."

* cited by examiner

ACCELERATED ROW DECOMPRESSION

FIELD

The field of the invention relates to database management and, more particularly, to techniques for hardware accelerated row decompression.

BACKGROUND

Efficient processing and monitoring of data is becoming increasingly important as businesses, governments, entities and individuals store and/or require access to growing amounts of data. This data is often stored in databases.

As one example, business growth and technology advancements have resulted in growing amounts of enterprise data. In order to gain valuable business insight and competitive advantages, real-time analytics on such data must be performed. Real-time analytics, however, involves expensive query operations which may be time consuming on traditional CPUs. Additionally, in traditional database management systems (DBMS), CPU resources are dedicated to transactional workloads.

Traditional approaches to real-time analytics have focused on creating snapshots of data in a database to perform analytics or offloading expensive real-time analytics query operations to a co-processor to allow for execution of analytics workloads in parallel with transactional workloads.

SUMMARY

Embodiments of the invention provide techniques for hardware accelerated row decompression.

For example, in one embodiment, an apparatus comprises a hardware accelerator coupled to a memory. The hardware accelerator comprises one or more decompression units. The one or more decompression units are reconfigurable.

Further embodiments of the invention comprise one or more of the following features.

The hardware accelerator is a field-programmable gate array.

The one or more decompression units, in the aggregate, are operative to decompress one or more rows of a database at a bus speed of the coupling between the hardware accelerator and the memory.

Two or more decompression units are operative to decompress two or more rows of a database in parallel.

Each of the one or more decompression units stores a first decompression dictionary in a corresponding dictionary buffer so as to allow for parallel decompression of two or more rows of a first table of a database.

A first one of the one or more decompression units stores a first decompression dictionary in a first dictionary buffer and a second one of the one or more decompression units stores a second decompression dictionary in a second dictionary buffer so as to allow for parallel decompression of two or more rows from two or more different tables of at least one database.

Advantageously, one or more embodiments of the invention allow for hardware accelerated row decompression.

These and other embodiments of the invention will become apparent from the following detailed description of illustrative embodiments thereof, which is to be read in connection with the accompanying drawings.

DETAILED DESCRIPTION

Illustrative embodiments of the invention may be described herein in the context of an illustrative apparatus, method or system etc. However, it is to be understood that embodiments of the invention are not limited to the illustrative apparatuses, methods or systems described but are more broadly applicable to other suitable apparatuses, methods and systems.

Embodiments of the invention provide several advantages relative to conventional techniques. For example, snapshot processing or warehousing requires taking a snapshot of data from an online transaction processing (OLTP) system at a particular time. Analytics and query operations are performed on the snapshot rather than on the OLTP. However, when a database is frequently updated, snapshots which are months, weeks, days, or even hours old may not be sufficient since many applications require analytics on real-time transactional data in an OLTP system.

Performing expensive analytics queries on real-time data poses significant challenges to existing systems. One challenge is that system resources such as CPU and I/O resources must be shared between transactional and analytical workloads. Normally, transactional workloads are subject to stringent Service Level Agreements (SLAs). In addition, transactional workloads are often tied directly to revenue generation and are thus the primary focus of a business. As such, techniques are required which allow for analytical workloads to run against the same data as transactional workloads without impacting SLAs of transactional workloads. CPU and I/O resource issues must be addressed to meet these challenges.

Figure 1:
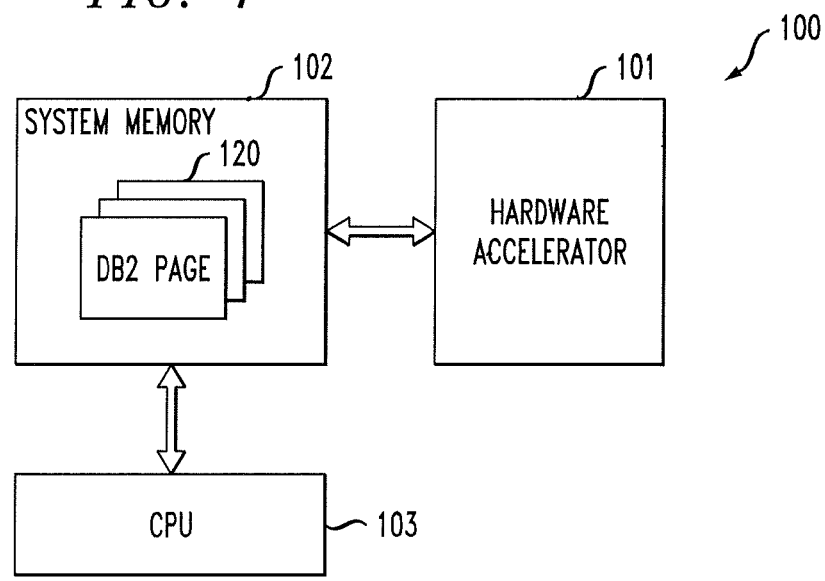
FIG. 1 illustrates a system organization, according to an embodiment of the invention.

Embodiments of the invention address CPU resource issues by utilizing a hardware acceleration approach to offload and accelerate decompression operations. FIG. 1 illustrates an embodiment of a system 100 of the invention. The system 100 is shown with a hardware accelerator 101 coupled to a system memory 102. The system 100 uses the DB2™ DBMS software (International Business Machines Corp.). It is important to note that this is merely one example of DBMS software, and that the invention is not limited solely to use with DB2 but is instead more generally applicable to other DBMS and software. A set of DB2 pages 120 is stored in the system memory. The system memory 102 is also coupled to a CPU 103.

While system 100 shows a single hardware accelerator 101, system memory 102, and CPU 103 for clarity purposes, the invention is not limited to a single CPU, system memory or hardware accelerator. For example, embodiments of the invention may have multiple hardware accelerators coupled to a system memory, a system memory may store multiple databases, more than one CPU may be coupled to the system memory, more than one system memory may be coupled to the CPU, etc. In addition, systems may contain additional components not shown in FIG. 1.

In some embodiments, the hardware accelerator 101 is a field-programmable gate array (FPGA). The hardware accelerator 101 is operative to retrieve DBMS data, which may be stored in a set of DB2 pages 120, from system 102. Expensive decompression operations may be performed in the hardware accelerator 101 and the results may be sent back to the system memory 102. Embodiments of the invention integrate a hardware accelerator such as a FPGA into a host system and perform data decompression in the hardware accelerator which saves considerable CPU resources compared to conventional systems. Other query operations such as predicate evaluation may also be performed in the hardware accelerator.

In a relational DBMS, records are stored in objects called tables. Records are often referred to as rows, and record attributes are often referred to as columns or fields. Table 1 below is a simplified illustration of a three-row table with six attribute columns (PhoneNumber, FirstName, LastName, Age, State, SalesTotal($)) per row.

TABLE 1

| PhoneNumber | First Name | Last Name | Age | State | SalesTotal($) |
| --- | --- | --- | --- | --- | --- |
| 212-111-1111 | Ann | Smith | 25 | NY | 250.54 |
| 212-111-0000 | Steve | Jones | 31 | NY | 500.00 |
| 203-222-2222 | Emily | Brown | 29 | CT | 900.01 |
| 201-333-3333 | Thomas | Clarks | 21 | NJ | 100.23 |

Typically, the physical unit of storage and I/O processing of a non in-memory database table is a page. Page in a table are the same size such as 4 KB, 8 KB, 16 KB, 32 KB, etc. A database will normally have a designated memory space such as system memory 102 in FIG. 1, which may be referred to herein as a buffer cache or buffer pool (BP), for temporarily storing data pages. Relational data operations get data pages from the BP and the I/O operations between the BP and a disk are managed transparently. When a page is updated (which may include insertions and/or deletions), the BP image is committed first, before eventually being written to the disk. Embodiments of the invention connect a hardware accelerator 101 to a system memory 102 rather than an I/O path between system memory 102 and a disk to enable the processing of the latest data in the system memory 102.

In transactional database systems, data is typically stored in a row-based layout where all the columns of a row are stored in contiguous space. A page is a collection of slots that each contains a row. Each page has an associated pageID and each slot has a slot number. At the end of a page, there is an array whose entries contain the offsets of the rows within the same page. The pair <pageID, slot number> is often referred to as record ID (RID), which uniquely identifies a row within a table. When processing a row in a table, the corresponding page which contains the row is read from the BP and the row offset is used to extract the row from the page. If a row is deleted, its corresponding slot number holds an invalid value.

Embodiments of the invention may be described herein with reference to Structured Query Language (SQL), which has become the de facto standard language for schema definition, data manipulation and data query for relational DBMS. The invention is not limited for use solely with SQL DBMS, but rather may be used for DBMS using other languages. SQL predicate evaluation refers to the process of retrieving those DBMS table rows that qualify under some criteria. A query typically may require logical inequality or equality comparisons of fields from records against constants, or test set containment for a field in a record. For example, with reference to Table 1 above, the SQL statement "SELECT salesTotal FROM Customer WHERE state='NY' AND age <30" asks for the sales dollar amount from all customers in NY that are younger than 30 years old.

Data compression is embedded in most DBMS. OLTP applications typically only access a single or a small number of related rows, so OLTP systems typically select the database row as the unit of compression. DBMS data structures allow database logic to find the row, and the DBMS decompresses the row before processing. In the absence of indexes, the DBMS must scan a table, decompress each row, and then apply SQL predicates against the decompressed row. DBMS may have a built-in decompression technique which proceeds by taking some part of an input string and matching it against strings in a dictionary to retrieve the input string's decompressed representation. Concatenating various decompressed fragments reproduces the decompressed row. Decompression, being a per-byte operation, may require a large number of CPU cycles. As the number of rows queried increases, the number of CPU cycles required to decompress the rows can become prohibitively large. Embodiments of the invention reduce the cost of decompression on CPU resources by executing decompression on a hardware accelerator such as a FPGA.

Figure 2:
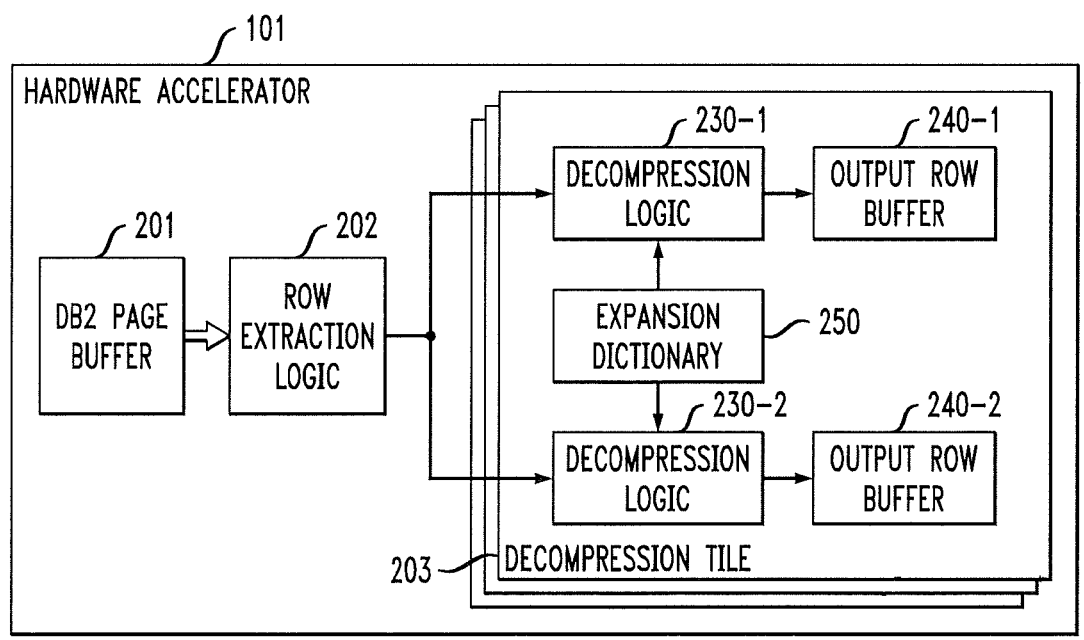
FIG. 2 illustrates a hardware accelerator, according to an embodiment of the invention.

FIG. 2 shows an example of the hardware accelerator 101 shown in FIG. 1. The hardware accelerator includes a DB2 page buffer 201, which receives one or more pages from the system memory 102. Pages in the DB2 page buffer 201 are sent to a row extraction logic unit 202 which extracts the rows from the pages as described above. Rows are then sent to one or more decompression tiles 203. Each decompression tile 203 may contain a number of decompression logic units 230. FIG. 2 shows an example where each decompression tile has two decompression logic units 230-1 and 230-2. Each of the decompression logic units 230 is coupled to an expansion dictionary 250. In the example of FIG. 2, the two decompression logic units 230-1 and 230-2 share a single expansion dictionary 250. In other embodiments, each decompression logic unit may be coupled to a separate expansion dictionary or to more than one expansion dictionary. In some embodiments, a first decompression logic unit may be coupled to a first expansion dictionary and a second decompression logic unit may be coupled to a second expansion dictionary.

The expansion dictionary 250, which may be referred to herein as a decompression dictionary, is used to look up strings or symbols in a row to determine a decompressed value of a particular string or symbol. Once the decompression logic unit has looked up each string in a particular row, a decompressed row is sent to an output buffer. In FIG. 2, each decompression logic unit 230 has a respective output row buffer 240. Decompression logic unit 230-1 is coupled to output row buffer 240-1 and decompression logic unit 230-2 is coupled to output row buffer 240-2. While not shown in FIG. 2, the decompressed rows stored in the output row buffers may be sent to further processing units to perform operations such as predicate evaluation in the hardware accelerator. The decompressed rows stored in the output row buffers 240 are then sent back to the system memory 102.

Figure 3:
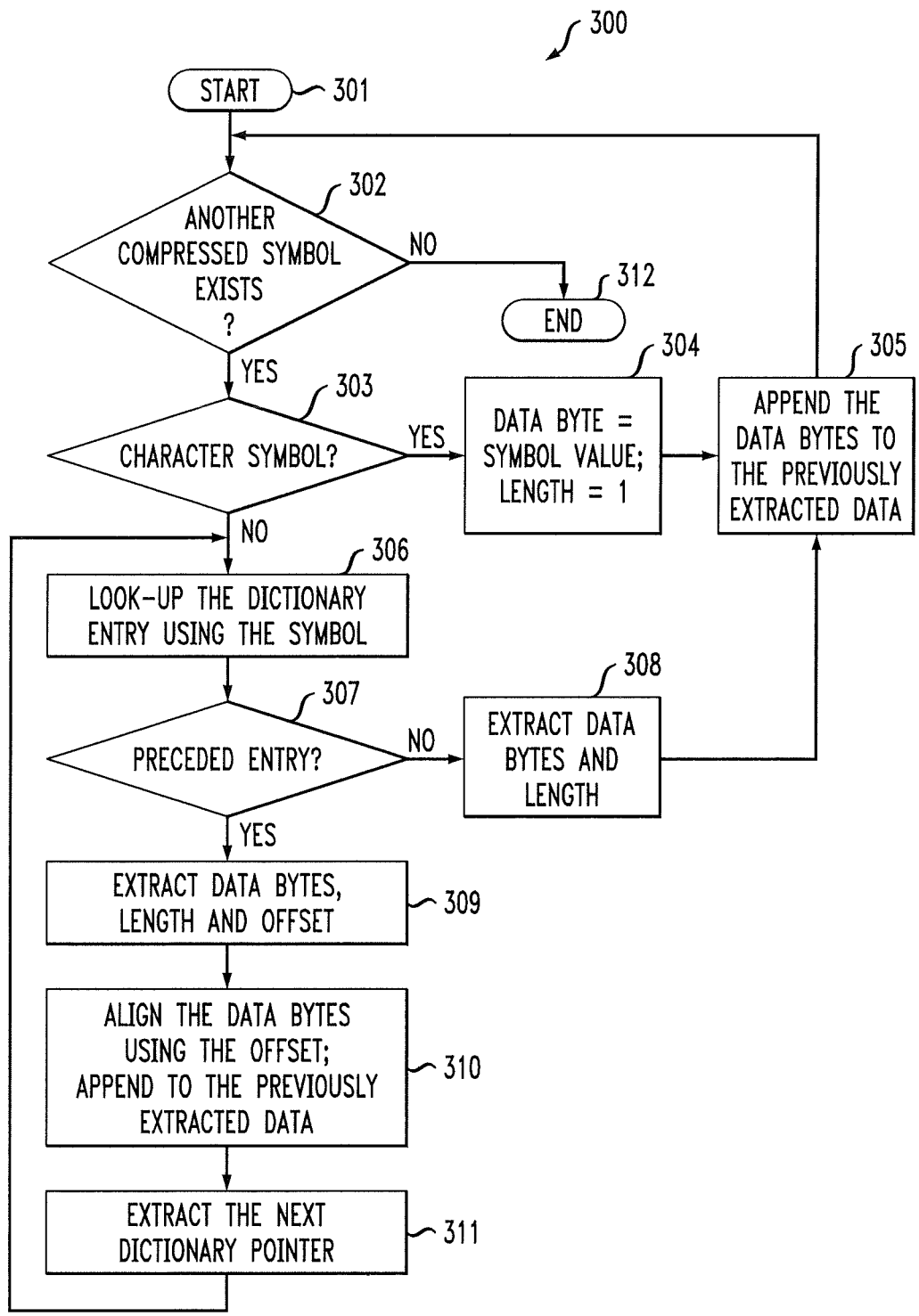
FIG. 3 illustrates a methodology of row decompression, according to an embodiment of the invention.

FIG. 3 illustrates a methodology of row decompression which may be implemented on one of the decompression logic units 230 of the hardware accelerator 101. The methodology starts 301 by receiving a compressed row. First, a determination is made 302 as to whether there is at least one compressed symbol remaining. If at least one compressed symbol exists, the methodology 300 continues with determination 303, otherwise the process ends. If at least one compressed symbol remains, a determination is made 303 as to whether a compressed symbol of the compressed row is a character symbol. If the compressed symbol is a character symbol, the decompressed data byte is set 304 equal to the symbol value and has a length set equal to 1. This decompressed data byte is appended 305 to the previously extracted data bytes and the methodology 300 loops back to determination 302. If a determination is made that the compressed symbol is not a character symbol, the methodology looks up 306 the dictionary entry for the compressed symbol. The dictionary entries are stored in an expansion or decompression dictionary, shown as 250 in FIG. 2.

Next, a determination is made 307 as to whether the dictionary entry is a preceded entry. A dictionary entry can be one of two types: an unpreceded entry which contains data bytes and a length field or a preceded entry which contains data bytes, a length field, an offset and a pointer to the next dictionary entry in the chain. If the dictionary entry is a preceded entry, the data bytes, length and offset are extracted 309 and the data bytes are appended to the previously extracted data. The next dictionary pointer is then extracted 311 from the dictionary entry. The process then loops back to step 306 and looks up the next dictionary pointer. If the dictionary entry is not a preceded entry, the data bytes and length of the entry are extracted 308 from the dictionary entry. The extracted data bytes are then appended to the previously extracted data 306 and the process loops back to determination 302.

Figure 4:
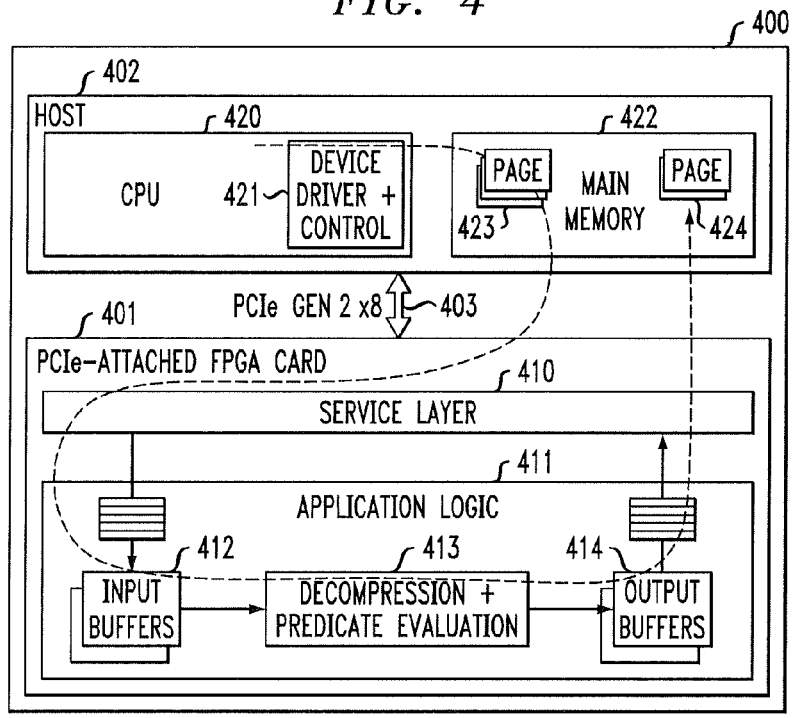
FIG. 4 illustrates an alternate system organization, according to an embodiment of the invention.

FIG. 4 illustrates a high-level system architecture 400 for a FPGA-accelerated DBMS, according to an embodiment of the invention. In this embodiment, the hardware accelerator is a PCIe-attached FPGA card or FPGA 401. The FPGA 401 operates on DBMS in-memory data 423 and writes the results 424 back into the main memory 422 of the host CPU 420. Data may be transferred between the host 402 and the FPGA 401 using direct memory access (DMA) operations. Once the DBMS sends a job request to the FPGA 401, all the DMA operations are initiated by the FPGA 401 without any intervention from the host CPU 420. Note that while FIG. 4 illustrates an embodiment where FPGA 401 performs predicate evaluation in addition to row decompression, other embodiments may perform other processing in addition to or in place of predicate evaluation. In still other embodiments, FPGA 401 may be dedicated to row decompression and need not perform any additional processing.

FPGA 401 is coupled to host 402. When CPU 420 receives a query or other request to decompress a row, the CPU 420 sends a command to the FPGA 401 to stream one or more compressed pages 423 from the main memory 422 to the FPGA 401. The CPU 420 of FIG. 4 is shown with device driver and control software 421 to allow the host 402 to interact with the FPGA 401. FPGA 401 has a service layer 410 which controls the interface to the PCIe interface bus 403, direct memory access (DMA) engines and job management logic. The FPGA 401 also has application logic 411 which implements the functions required to process database queries on the FPGA. Application logic 411 has input buffers 412, decompression and predicate evaluation units 413 and outputs buffers 414. Compressed pages 423 are streamed from main memory 422 through the service layer 410 and application logic 411 for decompression and predicate evaluation. Decompressed rows 424 are sent back through the service layer 401 and stored in the main memory 422.

While FIG. 4 illustrates a FPGA 401 which is a PCIe FPGA, the invention is not limited solely to PCIe FPGAs. Embodiments of the invention may be implemented in various hardware accelerators such as FPGAs using various interfaces such as PCI, USB, eSATA, network-connected, etc.

The FPGA 401 is structured in a modular fashion with two distinct pieces of logic, the service layer 410 and the application logic 411. A set of well-defined interfaces exists between the two (not shown in FIG. 4) which includes data buses for input and output data, queues for DMA requests, and control signals.

On the host CPU 420, a job queue is maintained and the device driver and control software 421 and the service layer 410 cooperate to dispatch jobs to the FPGA 401. Once a job has been dispatched, the service layer 410 passes the job structures to the application logic 411 and signals the application logic 411 to begin processing. From then on, the service layer 410 only processes the DMA requests and updates the status of the jobs to the host 402. This structure allows the application logic 411 to be developed independent of the service layer 410.

In some embodiments of the invention, hardware accelerators are designed with two goals in mind: to support the most common cases in the target database system and to achieve maximum performance from the available hardware resources. As a result, the size of additional operations to be performed on the hardware accelerator, the database page buffer size and the decompression dictionary buffer size are chosen based on real-life customer workloads. These sizes may be described as fixed values herein, but one skilled in the art would readily recognize that supporting other sizes is trivial.

Figure 5:
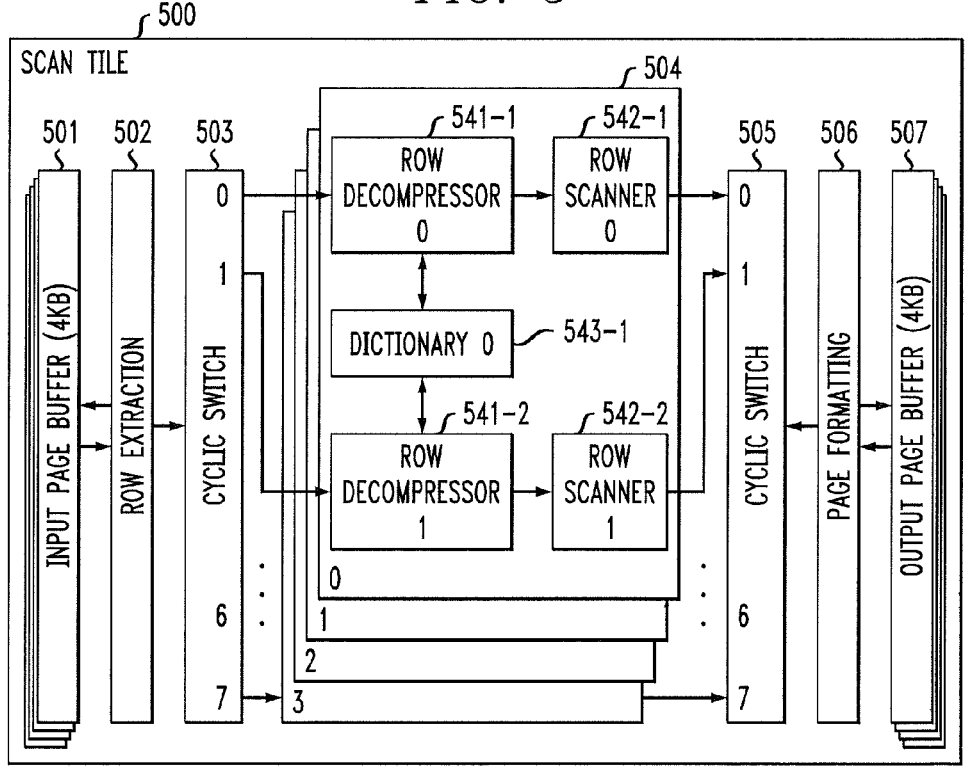
FIG. 5 illustrates a scan tile, according to an embodiment of the invention.

FIG. 5 illustrates a scan tile 500, which may be incorporated into a hardware accelerator. In the example of FIG. 5, scan tiles 500 perform row decompression and predicate evaluation. It is important to note that in other embodiments a scan tile may perform other processing in addition to or in place of predicate evaluation. In still other embodiments a scan tile may be dedicated to row decompression only. It is also important to note that FIG. 5 illustrates only one example of a scan tile 500 with specific numbers and sizes of various components such as page buffers, dictionaries, row decompressors, row scanners, etc. Numerous other configurations are possible, as will be readily apparent to one skilled in the art.

Multiple database rows are processed concurrently using parallel instances of row decompression and predicate evaluation logic within a scan tile 500. Feeding parallel execution units to obtain a balanced system requires careful rate matching and data staging. A scan tile 500 forms a balanced unit for scanning the rows. It encapsulates the design flow for scanning database rows on the hardware accelerator, and thus may be scaled simply by replicating decompression tiles 500.

A scan tile 500 scans one database page at a time. More than one page can be scanned in parallel by having multiple independent scan tiles on the hardware accelerator. FIG. 5 shows a scan tile with a 4 KB input page buffer 501. The scan tile 500 receives at least one page of a database and stores the page in the input page buffer 501. Row extraction unit 502 extracts one or more rows from the at least one page stored in the input page buffer 501. Extracted rows are sent to the cyclic switch 503. The example scan tile 500 is able to process 8 rows simultaneously. In the example of FIG. 5, the scan tile 500 has four units 504 (numbered 0, 1, 2, 3 in FIG. 5). Each unit 504 has two row decompressors 541, two row scanners 542, and a dictionary 543. For example, unit 504-0 shows row decompressors 541-1 and 541-2, along with row scanners 542-1 and 542-2 and dictionary 543. The dictionary 543 is shared between row decompressors 541-1 and 541-2. In other embodiments, each of the row decompressors 541 may have its own corresponding dictionary 543. Each row decompressor is also coupled to a row scanner. In unit 504-0, row decompressor 541-1 is coupled to row scanner 542-1 and row decompressor 541-2 is coupled to row scanner 542-2. The row decompressors 541 are operative to decompress a compressed row. In some embodiments, the row decompressors 541 are also operative to determine whether a row is compressed before processing the row, so as to save time and resources. Predicate evaluation may be performed by row scanners 542 on decompressed rows. The decompressed rows are then sent to cyclic switch 505 and then to page formatting unit 506. The page formatting unit 506 will create a decompressed page from one or more decompressed rows. The decompressed page is output to the 4 KB output page buffer 507. The decompressed pages stored in the output page buffer 507 may then be sent back to a host or sent for further processing in the hardware accelerator or another device.

In the example of FIG. 4, where the PCIe interface bus 403 running at full bandwidth delivers 16 B every cycle, two of the example scan tiles 500 would be required because each scan tile 500 has 8 row decompressors 541. This, however, assumes that the pages are uncompressed or have a small compression ratio. In order to utilize the full bandwidth of the interface bus 403 for highly compressed pages, more scan tiles would be required. For a given hardware accelerator, the number of scan tiles can be traded against the hardware consumed by other operations performed on the hardware accelerator. Depending on the query complexity and the compression ratio, different hardware configurations can be used. For example, if the hardware accelerator has 2 tiles for a total of 16 row scanners, each with 64 PEs, 16 rows may be decompressed in parallel and 1024 predicates may be evaluated in parallel. If a given query has fewer predicates to evaluate, more tiles can be used to allow for higher-level parallelism by reducing the number of other operations performed on the hardware accelerator. By performing decompression on-the-fly in a hardware accelerator such as a FPGA, embodiments of the invention provide numerous benefits. First, database pages can be sent directly from a host to a hardware accelerator without the need to pre-filter and decompress rows on the host. Second, offloading decompression to the FPGA increases the amount of computation per datum transferred to the FPGA. Thirdly, efficient parallel hardware implementation of the decompression algorithm results in improved performance. Finally, transferring compressed rows increases the "effective" transfer bandwidth. This is especially important since the overall accelerator performance is often limited by the available host-to-hardware accelerator data transfer bandwidth. Depending on the compression ratio, transferring compressed rows increases the effective bandwidth by a factor of 2 to 5.

Figure 6:
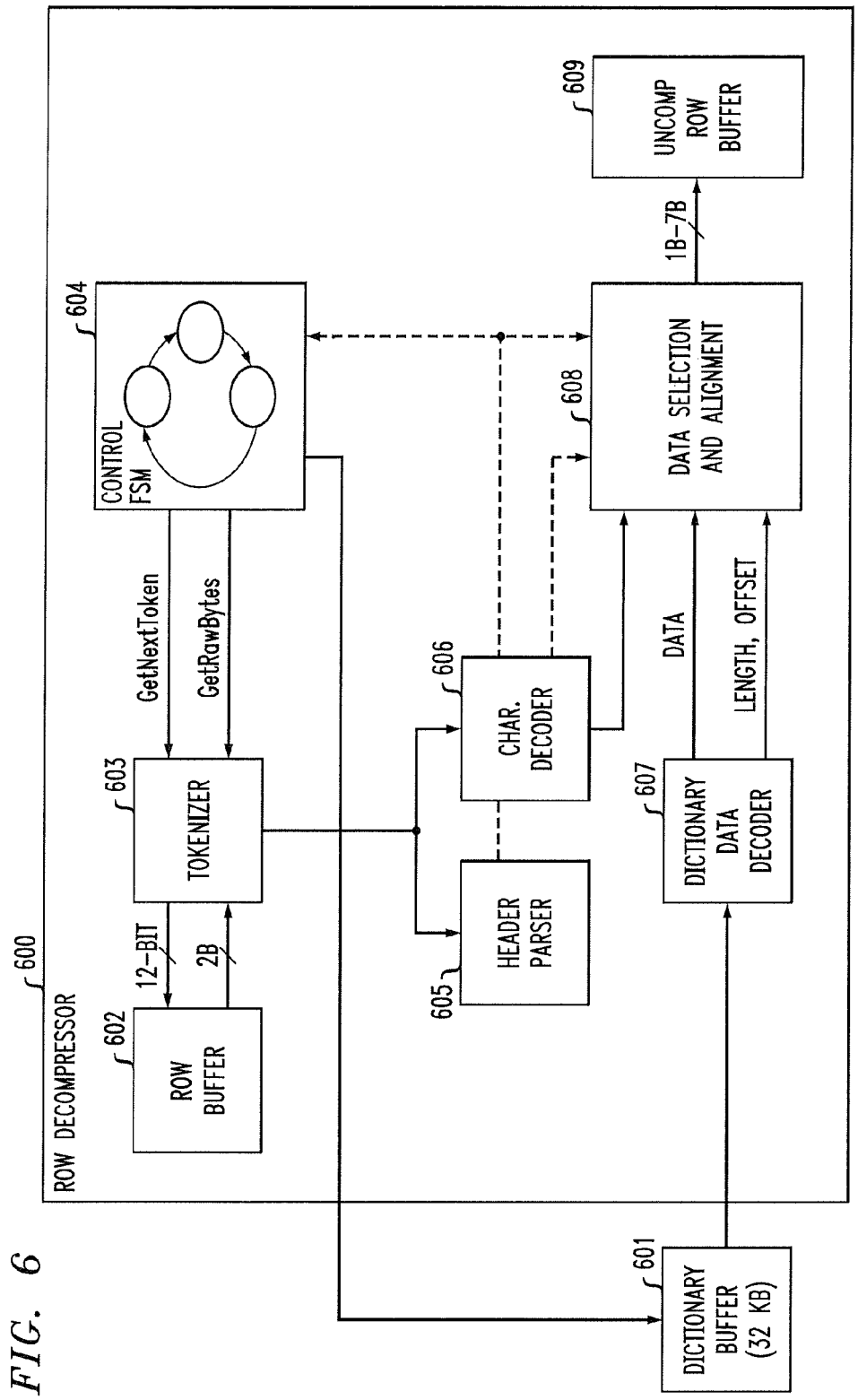
FIG. 6 illustrates a row decompressor, according to an embodiment of the invention.

FIG. 6 illustrates an example of a row decompressor 600. One or more row decompressors may be on a single scan tile 500 as shown in FIG. 5. Each row decompressor 600 has access to a dictionary buffer 601. In the example of FIG. 6, the dictionary buffer is 32 KB. The row decompressor 600 shown in FIG. 6 assumes that a compressed row consists of one or more 12-bit compressed symbols (tokens). Each symbol or token may either represent a character of the uncompressed row or a pointer to a dictionary entry, which in turn may contain up to 7 characters of the uncompressed row. The decompression operation involves decoding all the compressed symbols in a row and building the uncompressed row by stitching together character data from each of them.

During an initial set-up phase, the decompression dictionary is downloaded from the host into the dictionary buffers of the hardware accelerator. After the initial set-up phase, the decompression dictionary can be re-used for subsequent jobs. If a new decompression dictionary is required for a job, it will be downloaded from the host in a subsequent set-up phase for that job. During a scan phase, database pages are streamed to the hardware accelerator. As shown in FIGS. 2 and 4, row extraction logic 202 or row extraction units 502 extract rows from these pages. The extracted rows are stored in a row buffer 602 of the row decompressor 600. Multiple row buffers 600 are associated with each row extraction logic so as to allow for required rate matching between row extraction logic and the row decompressor 600, as well as to provide each decompressor instance dedicated access to its respective rows in parallel to the rest. At the output of the row decompressor 600 is an uncompressed row buffer 609 which stores decompressed rows. The uncompressed row buffer 609 has a variable-bytes write interface, from 1 B to 7 B, to support variable output rates of the decompressor.

A given database page may contain compressed rows mixed with rows in raw form. The decompression logic of the row decompressor 600 thus works in two modes, a decompression mode and a pass-through mode. As a new row is fetched from the row buffer 602 to the tokenizer 603, which extracts one or more tokens from the row, a header parser 605 determines whether the row is compressed or raw. If raw, the row is simply passed along to the uncompressed row buffer 609.

For compressed rows, the tokenizer 603 fetches the compressed token from the row buffer 602, which is passed to the controller state machine 604 and the character decoder 605. For a character token, the data selection logic selects the 8-bit character from the character decoder 606, which is written into the uncompressed row buffer 609. For a dictionary token, the controller reads the 8-byte entry from the dictionary buffer 601.

A dictionary entry, as discussed above, may be either an unpreceded entry, which contains up to 7 bytes of data and length field, or a preceded entry, which contains up to 5 bytes of data, a length field, an offset and a pointer to the next chaining entry. For preceded entries, the uncompressed data bytes from different chaining dictionary entries are stitched in the reverse order. The offset indicates the relative position of the current data bytes within the complete uncompressed data for the current compressed token and the pointer points to the next chaining dictionary entry that must be read to continue decompressing the current token. Decompression of a compressed token is continued until an unpreceded entry is found.

The dictionary data decoder 607 decodes the dictionary entry and extracts the respective fields based on the entry type. The length and offset fields are used by the data selection and alignment module 608 to determine the address for writing the data into the uncompressed row buffer. For unpreceded entries, an offset of 0 is used, since data from the unpreceded entry represents the start of the uncompressed data for that token.

A row decompressor 600 in some embodiments requires the operations described above to be staged in pipelined fashion. The algorithm is not purely feed-forward, and thus a new token cannot be fetched until the previous one is completely decompressed. Similarly, a new dictionary entry cannot be read until the current one has been read and decoded.

To address this issue, token prefetch logic is added to the tokenizer 603. Token prefetch logic prefetches the next 8 tokens and stores them in a FIFO. With this approach, the next token is ready for processing as soon as the current one is finished. When the entire row is fully decompressed, any outstanding tokens in the FIFO are discarded and a new set of tokens are prefetched from the next compressed row. Adding prefetch logic can reduce decompression time by more than 50%.

Once rows are decompressed, they can be sent for further processing, such as downstream predicate evaluation logic for filtering based on query predicates. A row scanner is used to evaluate the database rows against the query. In the example of FIG. 5, each row decompressor 541 is coupled to a separate row scanner 542.

Embodiments of the invention reduce "chattiness" during the interactions between the host and the accelerator by performing a block level data operation within the DBMS query processing engine. More specifically, a long running predicate evaluation query is divided into multiple jobs for a hardware accelerator to process sequentially. Each job consists of a number of data pages as input for the FPGA to read, and an output buffer into which the FPGA writes the results. Both data transferring action are initiated by the FPGA.

Figure 7:
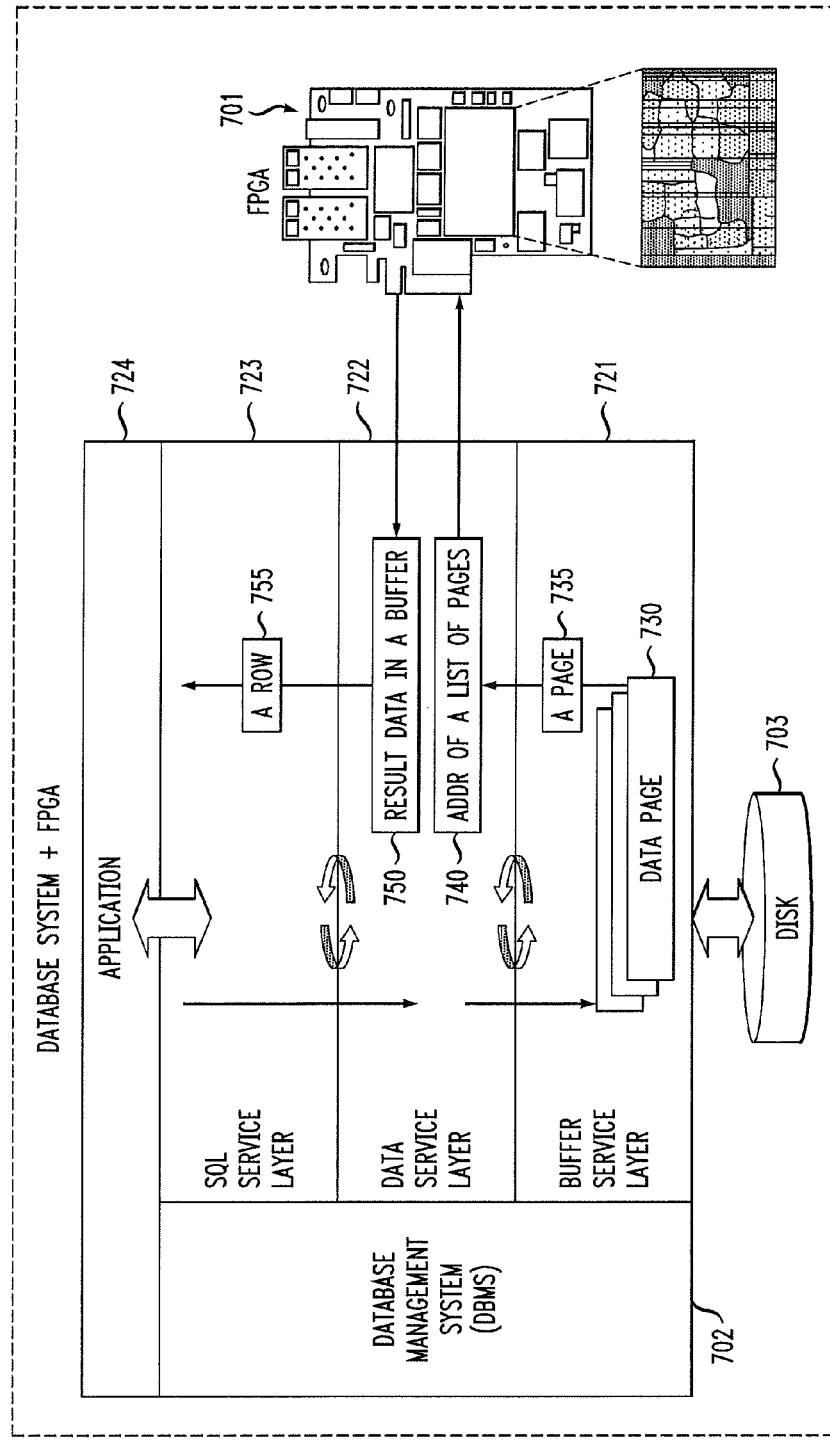
FIG. 7 illustrates an implementation of block-level data processing, according to an embodiment of the invention.

FIG. 7 illustrates an implementation of block-level data processing in a DBMS 802 and FPGA 801, as opposed to a one page or one row at a time processing flow. A set of data pages 730 are read from disk 703. A list of BP pages or addresses 740 is obtained by the data service layer 722 from the buffer service layer 721. The FPGA 701 reads the list of BP pages 740. The FPGA 701 outputs result data in a buffer 750. The DBMS 702 will pre-allocate a large enough buffer that is filled by the FPGA 701 with results. Data in the buffer 750 is formatted such that it conforms to the structure that is understood by the DBMS processing engine for further downstream processing so additional data copy and formatting software can be avoided. A row 755 from the buffer 750 is sent to the SQL service layer 723. An application 724 can read or write data in the SQL service layer 723.

The FPGA 701 and the DBMS 702 communicate through a series of control blocks that are passed from the host to the FPGA 801. The control blocks carry the necessary information for describing the operations and data transfers.

In some embodiments, the hardware accelerator is a FPGA. In the example of FIG. 4, the hardware accelerator is a PCIe-attached FPGA card 401. FPGA 401 does not have direct addressability to the host memory such as main memory 422, all in-memory data blocks and control information blocks need to be transferred to the FPGA 401 via DMA over the PCIe bus 403. When constructing the communication protocol between software and the FPGA 401, the DMA addresses for the memory are used instead of the host addresses.

A given query may be broken up into multiple jobs. A job is submitted to FPGA 401 via a host control block (HCB), which encapsulates the job information but is independent of the application logic. The HCB is interpreted by the service layer 410 of the FPGA 401; it carries information such as whether the current HCB is the last job in the queue, the DMA address of the decompression control block (DCB), as well as updatable fields indicating an active job's status. A queue of HCBs is maintained which allows more jobs to be queued while a job is active on the FPGA 401. FPGA 401 will continue to the next job in the queue, if one is available, when the current job is completed.

Figure 8:
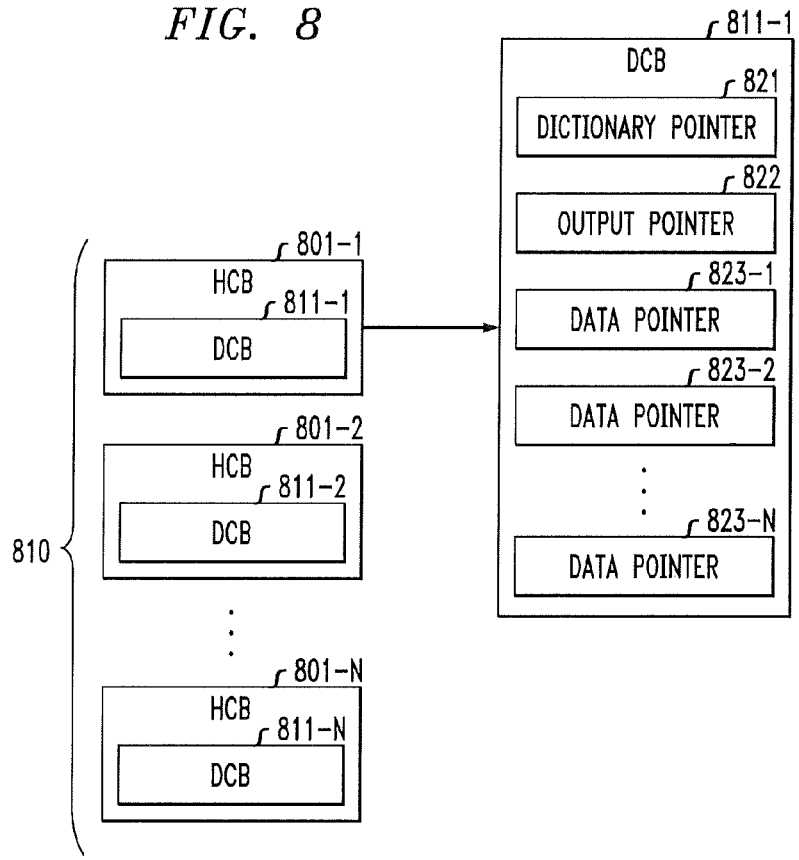
FIG. 8 illustrates decompression control blocks, according to an embodiment of the invention.

FIG. 8 illustrates an example of HCBs and DCBs. A HCB queue 810 is shown with HCBs 801-1 to 801-N. Each HCB 801 contains a corresponding DCB 811. For example, HCB 801-1 includes a DCB 811-1. DCB 811-1 contains a number of pointers as shown in FIG. 8. For example, DCB 811-1 includes a dictionary pointer 821, an output pointer 822 and data pointers 823-1 to 823-N. Dictionary pointer 821 contains information regarding the dictionary or dictionaries required to decompress pages of a database. While DCB 811-1 is shown with only a single dictionary pointer 821, a DCB may include more than one dictionary pointer. Output pointer 822 specifies an output for decompressed pages of a database. Data pointers 823-1 to 823-N point to pages of a database. HCBs 801 of FIG. 8 may include information on further processing to be performed in a hardware accelerator. Such information may be included in a corresponding DCB, or may be included in another portion of the HCB outside of the DCB. In addition, a given HCB may contain more than one DCB.

As will be appreciated by one skilled in the art, aspects of the present invention may be embodied as a system, apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium (s) having computer readable program code embodied thereon.

Any combination of one or more computer readable medium(s) may be utilized. The computer readable medium may be a computer readable signal medium or a computer readable storage medium. A computer readable storage medium may be but are not limited to, for example, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Referring again to FIGS. 1-8, the diagrams in the figures illustrate the architecture, functionality, and operation of possible implementations of systems, methods and computer program products according to various embodiments of the present invention. In this regard, each block in a flowchart or a block diagram may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagram and/or flowchart illustration, and combinations of blocks in the block diagram and/or flowchart illustration, can be implemented by special purpose hardware-based systems that perform the specified functions or acts, or combinations of special purpose hardware and computer instructions.

Accordingly, techniques of the invention, for example, as depicted in FIGS. 1-8, can also include, as described herein, providing a system, wherein the system includes distinct modules (e.g., modules comprising software, hardware or software and hardware).

Figure 9:
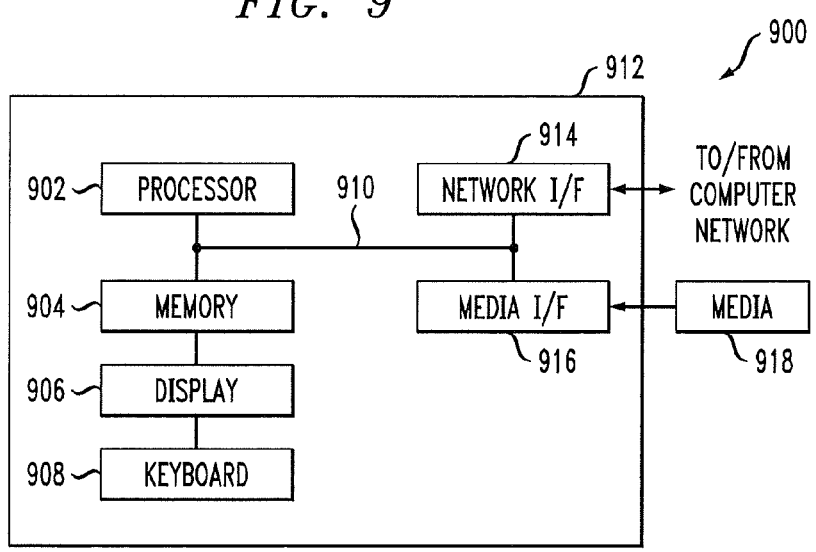
FIG. 9 illustrates a computing device in accordance with which one or more components/steps of techniques of the invention may be implemented, according to an embodiment of the invention.

One or more embodiments can make use of software running on a general purpose computer or workstation. With reference to FIG. 9, such an implementation 900 may employ, for example, a processor 902, a memory 904, and an input/output interface formed, for example, by a display 906 and a keyboard 908. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein, is intended to optionally include, for example, one or more mechanisms for inputting data to the processing unit (for example, keyboard or mouse), and one or more mechanisms for providing results associated with the processing unit (for example, display or printer).

The processor 902, memory 904, and input/output interface such as a display 906 and keyboard 908 can be interconnected, for example, via bus 910 as part of data processing unit 912. Suitable interconnections, for example, via bus 910, can also be provided to a network interface 914, such as a network card, which can be provided to interface with a computer network, and to a media interface 916, such as a diskette or CD-ROM drive, which can be provided to interface with media 918.

A data processing system suitable for storing and/or executing program code can include at least one processor 902 coupled directly or indirectly to memory elements 904 through a system bus 910. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboard 908 for making data entries; display 906 for viewing data; a pointing device for selecting data; and the like) can be coupled to the system either directly (such as via bus 910) or through intervening I/O controllers (omitted for clarity).

Network adapters such as a network interface 914 may also be coupled to the system to enable the data processing system to become coupled to other data processing systems or remote printers or storage devices through intervening private or public networks. Modems, cable modem and Ethernet cards are just a few of the currently available types of network adapters.

As used herein, a "server" includes a physical data processing system (for example, system 912 as shown in FIG. 9) running a server program. It will be understood that such a physical server may or may not include a display and keyboard. Further, it is to be understood that components may be implemented on one server or on more than one server.

It will be appreciated and should be understood that the exemplary embodiments of the invention described above can be implemented in a number of different fashions. Given the teachings of the invention provided herein, one of ordinary skill in the related art will be able to contemplate other implementations of the invention. Indeed, although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. An apparatus, comprising:
a hardware accelerator coupled to a memory, the hardware accelerator comprising one or more decompression units;
wherein the one or more decompression units are reconfigurable;
wherein the hardware accelerator is configured to receive information relating to a workload including decompression of at least one row of at least one page of a database and to reconfigure the one or more decompression units based on the received information; and
wherein the hardware accelerator is configured to:
receive one or more pages of the database;
extract one or more rows from each of the one or more pages of the database;
determine whether a given one of the extracted rows is compressed;
decompress, using at least one of the decompression units, the given extracted row responsive to determining that the given extracted row is compressed; and
output the decompressed row.

2. The apparatus of claim 1, wherein the hardware accelerator is a field-programmable gate array.

3. The apparatus of claim 1, wherein one or more decompression dictionaries are stored in a local memory of the hardware accelerator, each of the one or more decompression dictionaries corresponding to at least one table of a database.

4. The apparatus of claim 1, wherein the one or more decompression units, in the aggregate, are operative to decompress one or more rows of a database at a bus speed of the coupling between the hardware accelerator and the memory.

5. The apparatus of claim 1, wherein two or more decompression units are operative to decompress two or more rows of a database in parallel.

6. The apparatus of claim 1, wherein a first one of the one or more decompression units stores a first decompression dictionary in a first dictionary buffer and a second one of the one or more decompression units stores a second decompression dictionary in a second dictionary buffer so as to allow for parallel decompression of two or more rows from two or more different tables of at least one database.

7. The apparatus of claim 1, wherein two or more decompression units share a dictionary buffer.

8. The apparatus of claim 1, wherein the one or more decompression units comprise one or more configurable page buffers, dictionaries, row decompressors and row scanners.

9. The apparatus of claim 8, wherein the received information comprises a database page buffer size, a decompression dictionary buffer size, and a size of operations other than decompressing to be performed in the hardware accelerator for the workload.

10. The apparatus of claim 9, wherein the hardware accelerator is configured to adjust the respective numbers and sizes of the page buffers, dictionaries, row decompressors and row scanners of the one or more decompression units based on the received information.

11. A method, comprising:
transferring information related to a workload to a hardware accelerator, the workload including decompression of at least one row of at least one page of a database;
configuring a modular portion of the hardware accelerator based on the transferred information;
streaming one or more pages of the database to the hardware accelerator;
extracting one or more rows from each of the one or more pages of the database;
determining whether a given one of the extracted rows is compressed;
decompressing the given one of the extracted rows responsive to the determination; and
outputting the decompressed row;
wherein the decompressing step is performed in the hardware accelerator.

12. The method of claim 11, wherein:
the streaming step comprises streaming one or more pages of a database from a memory of a host central processing unit to the hardware accelerator; and
the outputting step comprises outputting the decompressed row from the hardware accelerator to the memory of the host central processing unit.

13. The method of claim 11, wherein:
the transferred information comprises a database page buffer size, a decompression dictionary buffer size, and a size of operations other than decompressing to be performed in the hardware accelerator for the workload; and
configuring the modular portion of the hardware accelerator comprises adjusting respective numbers and sizes of page buffers, dictionaries, row decompressors and row scanners in the hardware accelerator.

14. The method of claim 11, wherein the hardware accelerator is a field programmable gate array.

15. The method of claim 11, wherein the decompressing step comprises:
reading at least one compressed symbol from the given one of the extracted rows;
determining whether the compressed symbol is a character symbol;
extracting at least one data value from the compressed symbol; and
appending the at least one extracted data value to the decompressed row.

16. The method of claim 15, wherein when the compressed symbol is a character symbol, setting the at least one extracted data value equal to the character symbol.

17. The method of claim 15, wherein when the compressed symbol is not a character symbol, looking up a dictionary entry of the compressed symbol in a decompression dictionary.

18. The method of claim 17, wherein when the dictionary entry is a preceded entry, extracting an offset value of the dictionary entry to align the extracted data value.

19. The method of claim 11, further comprising the step of evaluating one or more predicates of a query for the decompressed row.

20. A method, comprising:
transferring information related to a workload to a hardware accelerator, the workload including decompression of at least one row of at least one page of a database;
configuring a modular portion of the hardware accelerator based on the transferred information;
streaming one or more blocks to the hardware accelerator;
extracting one or more pages of the database from each of the one or more blocks;
extracting one or more rows from each of the one or more pages;

determining whether a given one of the extracted rows is compressed;

decompressing the given one of the extracted rows responsive to the determination; and outputting the decompressed row;

wherein the decompressing step is performed in the hardware accelerator.

* * * * *